US010678667B1

(12) United States Patent
Majerus et al.

(10) Patent No.: US 10,678,667 B1
(45) Date of Patent: Jun. 9, 2020

(54) HOLDUP SELF-TESTS FOR POWER LOSS OPERATIONS ON MEMORY SYSTEMS

(71) Applicant: Micron Technology, Inc., Boise, ID (US)

(72) Inventors: Douglas Majerus, Boise, ID (US); Brent Byron, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/231,081

(22) Filed: Dec. 21, 2018

(51) Int. Cl.
*G06F 11/30* (2006.01)
*G06F 11/27* (2006.01)
*G11C 29/12* (2006.01)
*G06F 1/28* (2006.01)
*G06F 1/30* (2006.01)

(52) U.S. Cl.
CPC .............. *G06F 11/27* (2013.01); *G06F 1/28* (2013.01); *G06F 1/30* (2013.01); *G11C 29/12005* (2013.01)

(58) Field of Classification Search
None
See application file for complete search history.

(56) References Cited

U.S. PATENT DOCUMENTS

| | | | |
|---|---|---|---|
| 9,252,603 B2 | 2/2016 | Shim | |
| 9,432,298 B1* | 8/2016 | Smith | H04L 49/9057 |
| 2005/0060626 A1* | 3/2005 | Rajski | G01R 31/31838 |
| | | | 714/728 |
| 2005/0144394 A1* | 6/2005 | Komarla | G06F 12/0862 |
| | | | 711/137 |
| 2010/0011261 A1 | 1/2010 | Cagno et al. | |
| 2010/0052625 A1 | 3/2010 | Cagno et al. | |
| 2010/0205348 A1* | 8/2010 | Moshayedi | G11C 5/14 |
| | | | 711/102 |
| 2011/0231722 A1* | 9/2011 | Mukherjee | G01R 31/31854 |
| | | | 714/729 |
| 2013/0148457 A1 | 6/2013 | Sweere et al. | |
| 2017/0149880 A1* | 5/2017 | Lochhead | G06F 9/00 |
| 2017/0270069 A1 | 9/2017 | Breakstone et al. | |

FOREIGN PATENT DOCUMENTS

KR 20120027822 A 3/2012

OTHER PUBLICATIONS

International Search Report and Written Opinion dated Apr. 24, 2020, on Application No. PCT/US2019/068089.

\* cited by examiner

*Primary Examiner* — Mujtaba M Chaudry
(74) *Attorney, Agent, or Firm* — Lowenstein Sandler LLP (57) ABSTRACT

Described herein are embodiments related to holdup self-tests in memory sub-systems for power loss operations. A processing device receives a request to perform a holdup self-test to detect a defect in a holdup circuit that powers the processing device and a memory component in the event of power loss. The processing device identifies a memory location of memory that is available and, responsive to detection of a loss of power, performs a continuous sequence of write operations to the memory location using holdup energy until all of the holdup energy is expended. After reboot, the processing device determines a number of the write operations that were successfully completed in the memory location before all of the holdup energy was expended. The processing device determines whether the number satisfies a defect criterion. Responsive to the responsive to the number satisfying the defect criterion, the processing device reports the defect associated with the holdup circuit.

20 Claims, 6 Drawing Sheets

HOLDUP SELF-TESTS FOR POWER LOSS OPERATIONS ON MEMORY SYSTEMS

TECHNICAL FIELD

Embodiments of the disclosure relate generally to memory sub-systems, and more specifically, relate to holdup self-test in memory components of a memory sub-system with a holdup self-test for power loss operations on the memory sub-system.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to holdup self-tests in memory sub-systems for power loss operations. A memory sub-system is also hereinafter referred to as a "memory device" or "storage device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. The memory sub-system can be, for instance, a hybrid memory/storage sub-system. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system. Each memory component can include a different type of media. Examples of media include, but are not limited to, a cross-point array of non-volatile memory and flash based memory such as single-level cell (SLC) memory, triple-level cell (TLC) memory, and quad-level cell (QLC) memory.

One particular problem in conventional memory systems is that conventional memory systems are unable to verify that the memory system has enough power to complete expected operations during holdup. Holdup energy is energy that is used by the memory system in the event of loss of power from a primary, external power source. When there is a loss of power, the memory system can use a secondary power source, such as an array of capacitors, a battery, energy from a spinning disk, or the like, to permit the memory system to perform a set of power loss operations. The set of power loss operations can be various operations but can include writing data that should be preserved through the loss of power, such as data in transition from a host device and a memory component, data stored in volatile memory of the memory system, or the like. In order to have enough energy to ensure that the set of power loss operations can be performed, the conventional memory systems are designed to overcompensate for holdup energy. Another problem is that an amount of excess energy in these conventional memory systems cannot be estimated. This is problematic from a design standpoint because extra capacitors may be used unnecessarily. Also, during deployment of the conventional memory system, a defect in the secondary power source, such as one open capacitor in an array of capacitor, is unable to be detected. Similarly, conventional tests of these memory systems cannot detect other holdup circuit defects, such as open capacitors, improper resistor settings, improper storage chip functions, or the like.

Aspects of the present disclosure address the above and other deficiencies by estimating a number of operations that can be completed with a particular holdup design to show if it is meeting an expected design parameter, such as a holdup requirement. The aspects of the present disclosure can be used in a system that is required to maintain data integrity (i.e., data is expected to be written and saved to disk), especially in the event of loss of power. The aspects of the disclosure can also be used in any situation that requires special extended processes after power is lost. The special extended processes allow the system to some activity after power is cut to the system. Aspects of the present disclosure can be used as a customer diagnostic to evaluate whether a holdup design on a drive is still within specification while deployed in the field. For potentially safety-critical applications, such as automotive, a self-test can be used to monitor and diagnose specific defects required to meet a customer reliability requirement, a fault-detection requirement, or the like. The present disclosure of the holdup self-tests do not require specific hardware support, external measurement connections, or probe points, which reduces cost and board complexity. In some cases for safety-critical applications, hardware modifications can be made so that a device could fully self-test a holdup requirement. In other cases, there is coordination with a host device to cut system power to initiate the hold-up self-test as described herein. The disclosure holdup self-tests can detect marginal degradation in a holdup circuit, suggesting a defect that causes the holdup circuit to not satisfy a defect criterion. The marginal degradation can be detected by showing reduced capacity to complete holdup operations, also referred to herein as power loss operations. The self-test can serve as a correlation point for drive energy modeling, such as Monte Carlo drive energy modeling, allowing better understanding of drive power available and power consumed. This can result in better understanding of design criteria and better designs being produced, such as by enabling design options to reduce costs by removing unneeded energy storage (e.g., capacitors) or permitting execution of additional power loss operations on power down that can be used for performance improvements. The holdup self-tests can estimate a drive's actual ability to complete holdup operations by measuring both the available energy and the power required. The actual controller and memory components are engaged in the power estimation, so the energy required for the placed materials is incorporated into the measurements.

In one implementation, a memory system includes a power manager circuit, multiple memory components, and a controller. The power manager supplies power from an external power source or a secondary power source and can transition between power modes in the event of loss of power. The controller, in response to a request to perform a self-test for detecting defects in the secondary power source, can identify a set of available blocks in the memory components. The set of available blocks can be an available block in one or more of the memory components. Alternatively, the controller can identify a set of available memory locations in the memory locations. The memory locations can be a section of available non-volatile media that can record test progress. The controller detects a power loss condition in which power from the external power source is lost. Responsive to detection of the power loss condition, the controller continuously write test data in the set of available blocks in a specified pattern until an amount of power from the secondary power source is expended by supplying power to the controller and the plurality of memory components during the power loss condition. Responsive to restoration of the power from the external power source, the controller reads written data results from the set of available blocks and determines whether the secondary power source has a defect using at least the written data results. The controller can determine that the secondary power source has a defect when a number of write operations successfully completed satisfies a defect criterion. The defect criterion can correspond to a minimum energy capacity needed to perform a set of power loss operations to comply with a holdup requirement. Responsive to detection of the defect, the controller reports the defect of the secondary power source, such as by storing a record, sending a message, sending a signal, or the like. For examples, the controller can report the results of the test through a host device, logs, or other mechanisms. Alternatively, the controller can signal that the memory system could potentially be compromised using external communications.

In some cases, the controller identifies available blocks in NAND or NOR specific technologies. In another embodiment, the controller, in response to a request to perform a self-test for detecting defects in the secondary power source, can identify a set of one or more memory locations regardless of the memory technology being used. The memory location or block can be identified as a task during setup, rather than after loss of power. The memory location or block can be any section of available non-volatile media to record test progress. It should be noted that the holdup test can include activities that do not directly result in media write.

Figure 1:
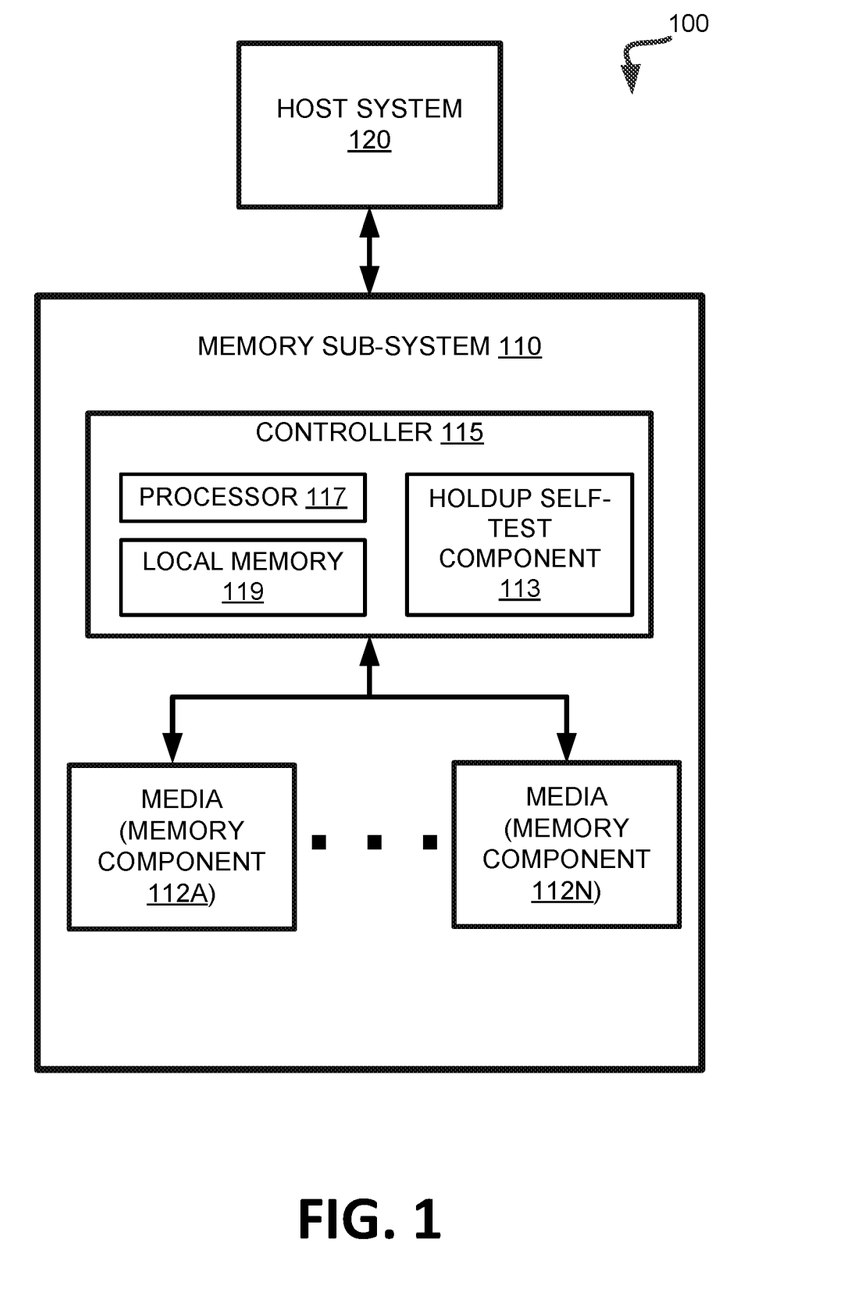
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120, also referred to herein as host device, can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a holdup self-test component 113 that can be used to perform a holdup self-test during a self-test mode of the memory sub-system 110. The holdup self-test component 113 can determine whether a holdup circuit, such as a secondary power source of the memory sub-system 110, has a defect. The defect may be a reduced holdup energy capacity that can be supplied by the holdup circuit to perform a set of power loss operations during holdup, i.e., a power loss condition in which power from a primary power source is lost or otherwise disconnected from the memory sub-system 110. The defect can be an open capacitor in an array of capacitors of the holdup circuit, a malfunctioning cell of a battery of the holdup circuit, an improper resistor setting in the holdup circuit, or an improper function by the holdup circuit, a storage chip, or a holdup energy source. The holdup self-test component 113 can trigger a holdup self-test operation responsive to a request from the host system 120, responsive to detecting that the memory sub-system 110 is placed in a self-test mode, or the like. In some embodiments, the controller 115 includes at least a portion of the holdup self-test component 113. For example, the controller 115 can include a processor 117 (processing device) configured to execute instructions stored in local memory 119 for performing the operations described herein. In some embodiments, the holdup self-test component 113 is part of the host system 120, an application, or an operating system.

The holdup self-test component 113 can receive a request to perform a holdup self-test to detect a defect in a holdup circuit that powers the processor 117 and the memory components 112A to 112N in the event of power loss. The holdup self-test component 113 identifies a block of memory that is available and, responsive to detection of a loss of power, performs a continuous sequence of write operations to the block using holdup energy until a specified amount of the holdup energy is expended. In some cases, the specified amount can be all of the holdup energy. In other cases, the specified amount can be a minimum amount of holdup energy where the memory system does not have sufficient power to perform a current operation or a next operation. Alternatively, the specified amount can be set at an arbitrary value for the holdup self-test to see how many representative operations can be performed given the specified amount. In some cases, the holdup self-test component 113 allows the specified amount to be programmable by a host device, a testing device, or the like. After reboot, the holdup self-test component 113 determines a number of the write operations that were successfully completed in the block before the specified amount of holdup energy (e.g., all of the holdup energy) was expended. The holdup self-test component 113 determines whether the number satisfies a defect criterion. Responsive to the responsive to the number satisfying the defect criterion, the holdup self-test component 113 reports the defect associated with the holdup circuit. Alternatively, the holdup self-test component 113 can perform a continuous sequence of representative operations to the memory locations. On bootup, the holdup self-test component 113 determines the number of representative operations completed. This can assume that part of the representative operation includes saving some sort of indicator to non-volatile memory that allows the holdup self-test component 113 to follow and count the number of representative operations completed. Additional details of the holdup self-test component 113 are described below with respect to FIGS. 2-5.

Figure 2:
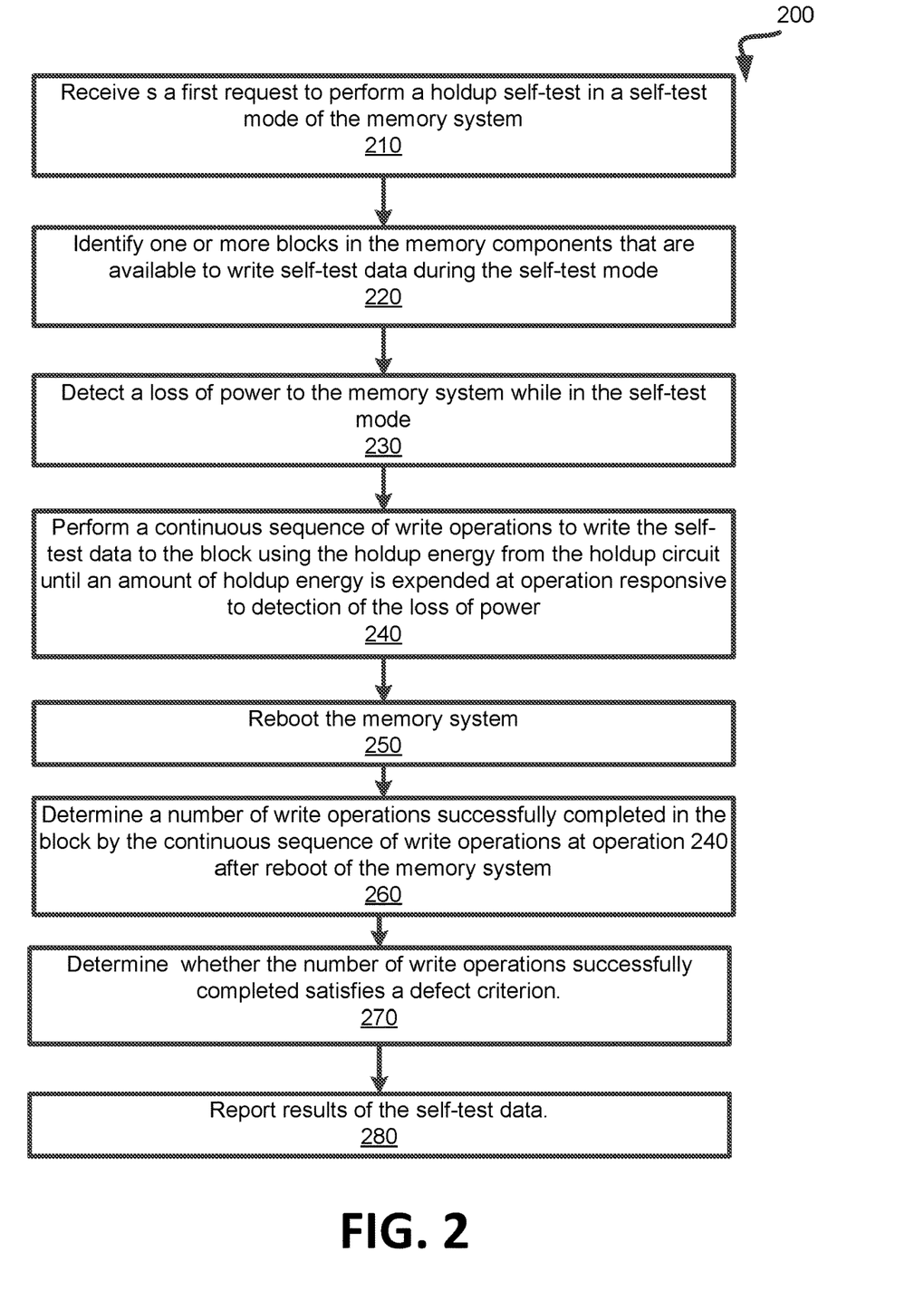
FIG. 2 is a flow diagram of an example method to perform a holdup self-test to determine whether a memory sub-system can provide enough energy to satisfy a holdup requirement for power-down operations in accordance with some embodiments of the present disclosure.

FIG. 2 is a flow diagram of an example method to perform a holdup self-test to determine whether a memory subsystem can provide enough energy to satisfy a holdup requirement for power-down operations in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the memory holdup self-test component 113 of FIG. 1. In another embodiment, the method 300 is performed by the processor 117 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For the method 200, a memory system includes a holdup circuit that provides holdup energy to a processing device and memory components of the memory system for a set of power loss operations. At operation 210, the processing logic receives a first request to perform a holdup self-test in a self-test mode of the memory system. The first request can be used to initiate a holdup self-test including one or more operations before a loss of power is detected, one or more operations performed while the holdup circuit provides holdup energy to the memory system, and one or more operations after the power is restored. The first request can be received from a host device during manufacturing or during deployment, from a test device during manufacturing, or the like. Responsive to the first request, the processing logic can place the memory system into a self-test mode. The self-test mode can be used to determine whether the holdup circuit is able to provide enough holdup energy for the memory system to perform a set of power loss operations in response to a power loss event. The self-test mode can check whether the holdup circuit has a defect that indicates that the holdup circuit is not able to comply with a specified holdup requirement.

During the self-test in the self-test mode, at operation 220, the processing logic identifies one or more blocks in the memory components that are available to write self-test data during the self-test mode. As noted herein, other types of available memory locations or designation of memory locations can be identified as being available to write self-test data during the self-test mode or during setup of the holdup self-test. At operation 230, the processing logic detects a loss of power to the memory system while in the self-test mode. In some cases, the processing logic waits for a next power loss event while in the self-test mode. In another cases, the processing logic initiates one or more operations that cause the power loss event to occur. For example, the processing logic can notify a host device that the memory system is in the self-test mode. In response, the host device can remove power from the memory system. This power can be a primary power source that is external to the memory system. In another case, the memory system can include a mechanism, such as a power management circuit or other circuitry that is capable of de-coupling the memory system from the external power source, resulting in the holdup circuit to provide the holdup energy to the memory system.

Responsive to detection of the loss of power, the processing logic performs a continuous sequence of write operations to write the self-test data to the block using the holdup energy from the holdup circuit until an amount of holdup energy is expended at operation 240. As described herein, the amount of holdup energy can be all of the holdup energy, as well as other amounts as described herein. Alternatively, the processing logic performs a continuous sequence of representative operations to the memory locations that result in a measureable count for the number of times that the process can be completed. It should be noted that the amount of holdup energy is expended to a point to which the write operations are unsuccessful in writing the self-test data to the blocks. At this point, the memory system is shut down because both the holdup circuit and the external power source are not supplying power to the memory system. When power is restored to the memory system, the memory system reboots at operation 250. In some implementations, the memory system reinitializes with special code to determine the number of successful operations. In some cases, the memory system can self-detect that the power has been fully drained and the second stage of the self-test should commence.

After reboot of the memory system, at operation 260, the processing logic determines a number of write operations successfully completed in the block by the continuous sequence of write operations at operation 240. A write operation can be considered successful when the write operation successfully writes data to the block as verified by a subsequent read of the block. In some cases, the operation can be considered a success if the values saved to non-volatile memory are completed successfully. For example, data was written to a NAND component and this data is re-read from the NAND component. In other cases, the processing logic can execute an operation and leave a single bit indicator in a NOR component that the operation was completed. The processing logic can execute a subsequent operation and leave a next bit indicator in the NOR component that the subsequent operation was completed, and so forth. When all of the holdup energy is expended, a write operation will not successfully complete because no data is written to the block that can be read and verified by the subsequent read operation. The self-test data read from the block by the read operation can be compared with control data to determine the number of write operations successfully completed in the block by the continuous sequence of write operations at operation 240.

At operation 270, the processing logic determines whether the number of write operations successfully completed satisfies a defect criterion. At operation 280, the processing logic reports results of the self-test data. Responsive to the number of write operations successfully completed satisfying the defect criterion at operation 280, the processing logic reports a defect associated with the holdup circuit. In some cases, the defect is reported be self-reported and set a fail indicator. In other cases, the defect can be reported by forwarding a fail indicator to the host device. Alternatively, responsive to the defect being detected, the memory system could be put into a safe state where it would not accept new data until the defect is resolved. Responsive to the number of write operations successfully completed not satisfying the defect criterion at operation 280, the processing logic reports that the holdup circuit does not have a defect. The defect criterion is programmable and can be defined based on a holdup requirement of the memory system. The holdup requirement can be specified and tested during manufacturing. The holdup requirement can also be specified and tested during deployment, especially in applications where compliance with the holdup requirement is of higher importance.

Figure 3:
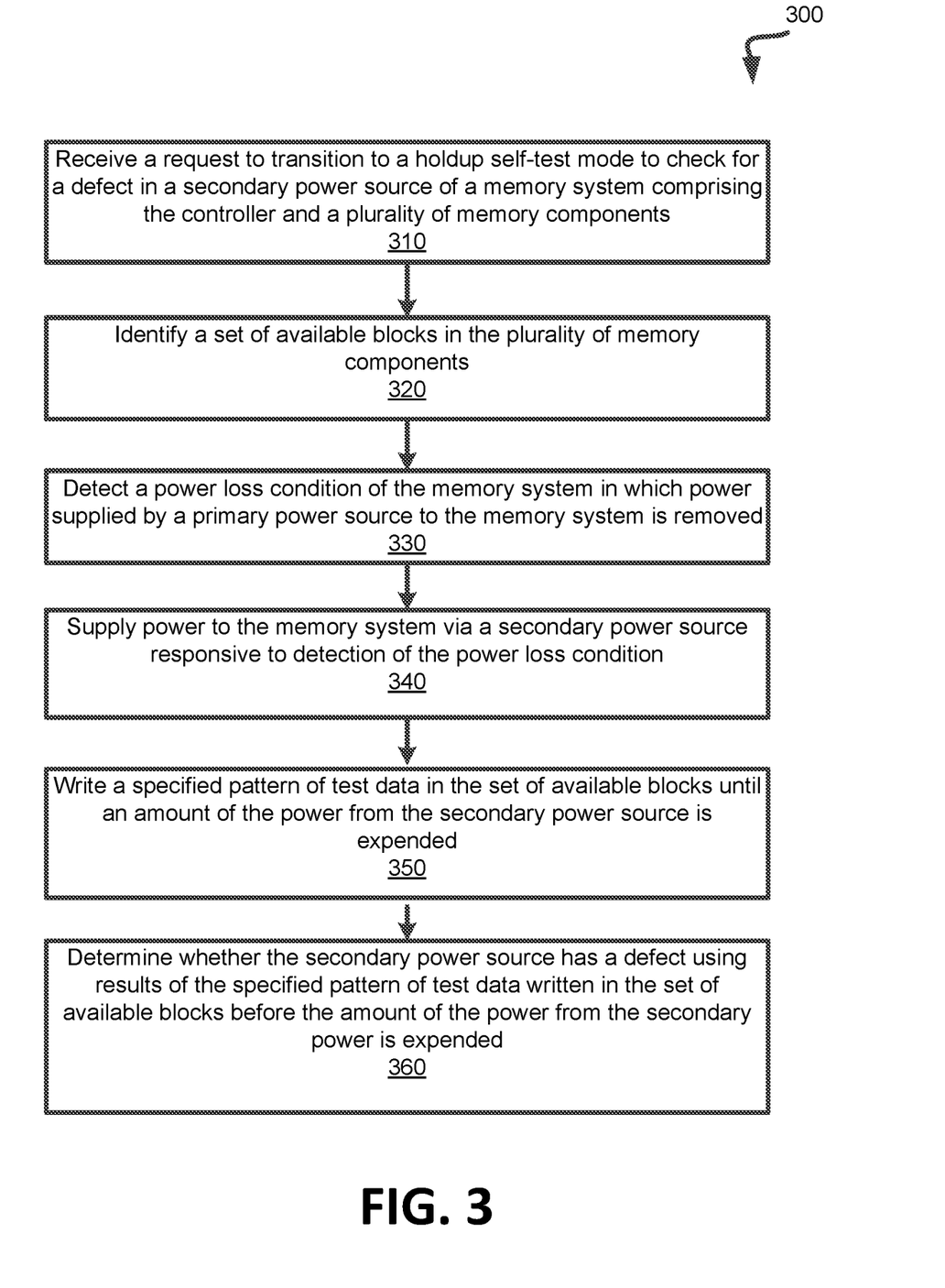
FIG. 3 is a flow diagram of an example method to check for defects in a secondary power source of a memory system in accordance with some embodiments of the present disclosure.

FIG. 3 is a flow diagram of an example method 300 to check for defects in a secondary power source of a memory system in accordance with some embodiments of the present disclosure. The method 300 can be performed by a controller comprising processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the memory holdup self-test component 113 of FIG. 1. In some embodiments, the method 300 is performed by the processor 117 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, a controller receives a request to transition to a holdup self-test mode to check for a defect in a secondary power source of a memory system comprising the controller and a plurality of memory components. In some cases, the request to transition to the holdup self-test mode could be part of a power on sequence or a boot up sequence. For example, this type of holdup self-test can be automatically initiated on power on, with the results reported and memory system fault indication up to and including rejection of all writes to disk until the fault is removed or fixed. At operation 320, the controller, responsive to the request, identifies a set of available blocks in the plurality of memory components. The set of available blocks can include at least one available block in each of the plurality of memory components. The set of available blocks can include at least one block in a memory plane or at least one block of a die of the memory component. At operation 330, the controller detects a power loss condition of the memory system in which power supplied by a primary power source to the memory system is removed. At operation 340, responsive to detection of the power loss condition, the controller supplies power to the memory system via a secondary power source and writes a specified pattern of test data in the set of available blocks until all of the power from the secondary power source is expended. At operation 350, responsive to restoration of the power to the memory system by the primary power source, the controller determines whether the secondary power source has a defect using results of the specified pattern of test data written in the set of available blocks before all of the power from the secondary power is expended.

In one embodiment, the controller determines whether the secondary power source has the defect by reading written data results from the set of available blocks, comparing the written data results with control data, and determining a number of write operations successfully completed before an amount of power (e.g., all power) from the secondary power source is expended based on the comparison. The controller can determine whether the number of write operations successfully completed satisfies a defect criterion. Responsive to the number of write operations successfully completed satisfying the defect criterion, the controller reports that the secondary power source has the defect. Responsive to the number not satisfying the defect criterion, the controller reports that the secondary power source does not have the defect.

In another embodiment, the controller receives the request from a host device coupled to the memory system. This can be during manufacturing or after manufacturing. For example, the controller receives the request from the host device after deployment of the memory system in a computer system. The request can be sent by the host device in response to a user request. Alternatively, the controller can receive the request in response to a scheduled event, such as after a specified period of time, or in response to a diagnostic test of the memory system that is initiated at any time, such as during manufacturing or during deployment of the memory system. In some cases, in which the host device sends the request to initiate the self-test by the memory system, the memory system can report the results of the self-test to the host device, such as via a logging mechanism, a response message, an interrupt, or the like. In other cases, the memory system includes a dedicated integrated circuit, referred to as a storage chip. The storage chip manages the power supplied to the memory system. For example, the storage chip can detect the loss of power from the external source and can send an interrupt to the processing device to indicate the power loss event. In some cases, optimization routines could be used. For example, there can be cases where energy storage is time dependent (x joules/second). The optimization routine can determine how much energy is required and fine-tune the boot-up process to save initial time. The interrupt received by the processing device can indicate a loss of power to the memory system by the primary power source. The storage chip can also supply the holdup energy from the secondary power source to the processing device and the memory components in order to perform the set of power loss operations during holdup. The self-test can be used to perform a continuous sequence of write operations to write the self-test data to one or more available blocks. The continuous sequence of write operations can be at least a part of a write pattern that emulates actual power loss operations performed during a power loss event to the memory system while the memory system is not in the self-test mode. The self-test can be used to determine whether the holdup energy is sufficient to perform the actual power loss operations during the power loss event.

Figure 4:
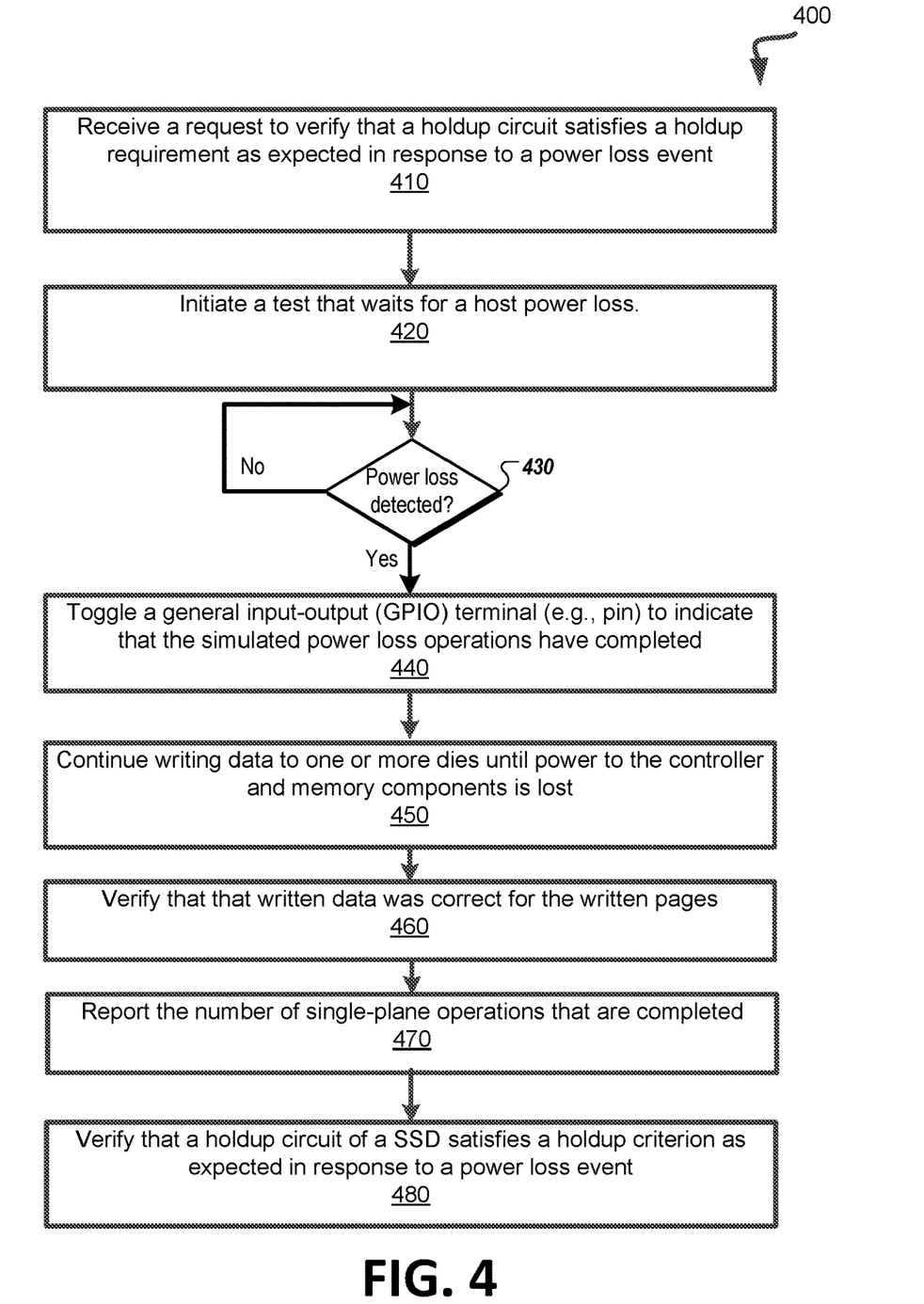
FIG. 4 is a flow diagram of an example method to verify that a holdup circuit of a SSD satisfies a holdup criterion as expected in response to a power loss event in accordance with some embodiments of the present disclosure.

FIG. 4 is a flow diagram of an example method 400 to verify that a holdup circuit of a SSD satisfies a holdup criterion as expected in response to a power loss event in accordance with some embodiments of the present disclosure. The method 400 can be performed to verify that the SSD has enough power to complete the expected operations during holdup and estimate an amount of excess holdup energy. The method 400 can also be used to validate a model used to design the memory system. In this manner, the memory system can be designed with sufficient holdup resources while optimizing costs of the design. For example, by validating the model, a memory system can be designed to have a lower number of capacitors in an array of capacitors when it is determines that the design has enough power from the array of capacitors (with the reduced number of capacitors as compared to a design that does not use method 400) to complete the expected power loss operations during holdup. The method 400 can be performed by processing logic of a SSD, the processing logic including hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the memory holdup self-test component 113 of FIG. 1. In some embodiments, the method 400 is performed by the processor 117 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic can receive a request to verify that a holdup circuit satisfies a holdup requirement as expected in response to a power loss event. The request can be issued through an interface as a command, such as a vendor-unique (VU) command. The VU command can be a custom command defined on some external protocol that can be used to initiate or receive information back from the holdup self-test. Alternatively, the request can be received as a serial port command via a serial port. At operation 420, the processing logic initiates a test that waits for a host power loss. At operation 430, the processing logic continues to check whether a power loss is detected. The power loss event can be an actual power loss or a simulated power loss for the test. When the power loss is detected at operation 430, the processing logic, such as a sequencer, can start a write sequence that commences on power loss. For example, during a power loss event, the processing logic can save data from ongoing QLC write operations and data in flight. Instead, for the test, the processing logic performs a certain representative number of multi-plane write operations, such as SLC write operations, across all die as set forth in an architecture estimation. These multi-plane write operations can be considered simulated power loss operations that happen in a self-test mode, as compared to actual power loss operations that happen during a normal mode. At operation 440, the processing logic can toggle a general input-output (GPIO) terminal (e.g., pin) to indicate that the simulated power loss operations have completed. The toggling of the GPIO terminal can be useful in characterization, as the holdup voltage level can be measured directly during characterization. Alternatively, a GPIO, host interface, sideband communication pathway, or the like can be used for signaling outside of the memory system to indicate that the simulated power loss operations have completed. At operation 450, the processing logic continues writing data, such as SLC single-plane page programs, to one or more dies until power to the controller and memory components is lost. This can give an indication of how many additional pages could be written before power is lost. At operation 460, on power up of the system memory, the processing logic can verify that written data was correct for all written pages. For example, if all multi-plane write operations were completed successfully, the SSD can complete holdup. At operation 470, the processing logic can report the number of single-plane operations that are completed. This can be done to prove a design margin, improving designs and reducing cost of designs. At operation 480, the report can indicate whether the holdup circuit of a SSD satisfies a holdup criterion as expected in response to a power loss event.

In other embodiments, the processing logic can test a power loss algorithm (PLA by initiating the continuous SLC write operations as described above and by initiating the power loss event itself. The amount of activity required for the PLA to save data would be dependent on items, such as media parameters, customer expectations, and other aspects of the product design. In some cases, this may require coordination with a host device to initiate the power loss event. Alternatively, the processing logic can wait until power loss event occurs, as initiated by the host device.

It should be noted that the processing logic can perform a test to evaluate an amount of holdup energy compared to an amount of energy needed by a drive to perform a set of power loss operations during holdup. The processing logic can be used for setting and characterizing the holdup energy requirements versus delivered on drives, but can also be used in a manufacturing flow or during an operating flow after manufacturing. The processing logic can be used to provide test coverage for out of specification items, referred to herein as defects, such as NAND power draws, tprog times, open capacitors, and other defects. The processing logic can perform a test to examine the holdup energy to verify that there is adequate capacitance for an expected distribution. For manufacturing it can be initiated as a process control test for data collection to determine a normal distribution of a write holdup and then screen limits or fail limits can be applied once there is sufficient data. This can improve an overall coverage since there is no in-circuit test (ICT). This is one method to monitor a bulk capacitance for holdup. In one implementation, specific test points or structures can be put into place so that the holdup array (or other holdup energy source) could be tested by an external measurement device. This approach would likely not take into account tolerances on energy demand. There are some complications that make it difficult to measure energy supply. Alternatively, a process control test can be used to monitor product throughput and indicate when the process has changed. The process control test can be used to understand process variation, set limits, and flag for further investigation if material deviates from those expectations.

In another embodiment, the processing logic can load a payload to initiate a drive (e.g., a prep state) for a self-test mode. The memory system can include an automatic test equipment (ATE) to coordinate power shut down. After the drive is initiated, the drive can return a "ready" status to the ATE to coordinate the power shutdown of the ATE. The ATE turns of the power to the drive and can be used to read and compare as set forth below. Once the drive detects a failure of power good, the workload can start. The workload may include a certain number of QLC write operations (e.g., 16 planes of QLC write operations), then followed by a certain number of SLC write operations until all or most power is lost. Using a workload with the QLC write operations followed by the SLC operations can accurately represent the energy needed of the "representative operations" as described herein. It should be noted that a time for the tester being off should be sufficiently outside of the time expected for the holdup. A next boot re-initiates the drive and will do a page read and compare to verify 'how far' the drive was able to commit writes prior to losing power. To make the reading and comparing easier, the processing logic can require organized data so that it becomes clear when the data becomes invalid. For example, the workload can be a pseudorandom data workload. The processing logic can generate a report. Rather, processing logic uses the report of the test as an estimate of a period of time (TIME) from the power loss event until the failed write commit operation is recorded. The report can also provide a failure page address. Also, the pages can be written in a normal order and the pages can span multiple physical locations (referred to as dispersion). In some testing system, there is communication back and forth to the host device, such as to signal to power down, cut power, comeback up, and complete the self-test. In other testing systems, the memory system can be plugged into a power supply where the memory system self-initiates the holdup self-test.

In some cases, the exact pattern of data written will be detailed after a holdup architecture is complete. The intention would be to demonstrate that the drive can complete the expected holdup case, and then do additional write operations to indicate margin. The holdup test can change based on what the host device would like to test. That is, the host device can specify certain parameters to simulate energy demands expected during power loss events. In some cases, the suggested metrics could be a number of pages write operations that the drive was able to complete after the expected holdup operations are accomplished.

In other cases, the self-test is initiated by putting the drive controller in a state where the self-test will be initiated with power loss. Open blocks on each NAND plane are identified and configured for the test. The host device removes power from the drive, or if the drive self-test is needed, the drive could incorporate hardware to remove host power from the drive. Upon loss of power, the drive uses the designed method for triggering the holdup operation. When the controller recognizes that the host power has been lost, the drive initiated a continuous write sequence. The write pattern typically tries to emulate operations required during a real power loss situation. The write pattern continues until all energy is expended from the drive and the maximum number of operations has been completed. Upon boot-up, the drive determines how many write operations were successfully completed before the power going down by reading the designated block and evaluating whether the written data matches the control data. The drive can erase test blocks and report results of the test through the host device, logs, or other reporting mechanisms. Conventional methods of drive detection are limited to determining a time for drive to charge a storage array of capacitors (e.g., time from power detected on until storage chip indicates that the power is good on the storage array). This conventional method would indicate whether the array or storage chip ever reached an expected value. Voltage triggers can also be used to indicate that an array has reached a certain charge value. Both of these existing methods do not make any evaluation as to whether the holdup energy is appropriate (e.g., high or low relative to a holdup requirement). The disclosure method has the ability to sense capacitor degradation, opens, or shorts on one or more of the capacitors in the storage array.

As described herein, the memory system can be a SSD, such as illustrated and described below with respect to FIG. 5.

Figure 5:
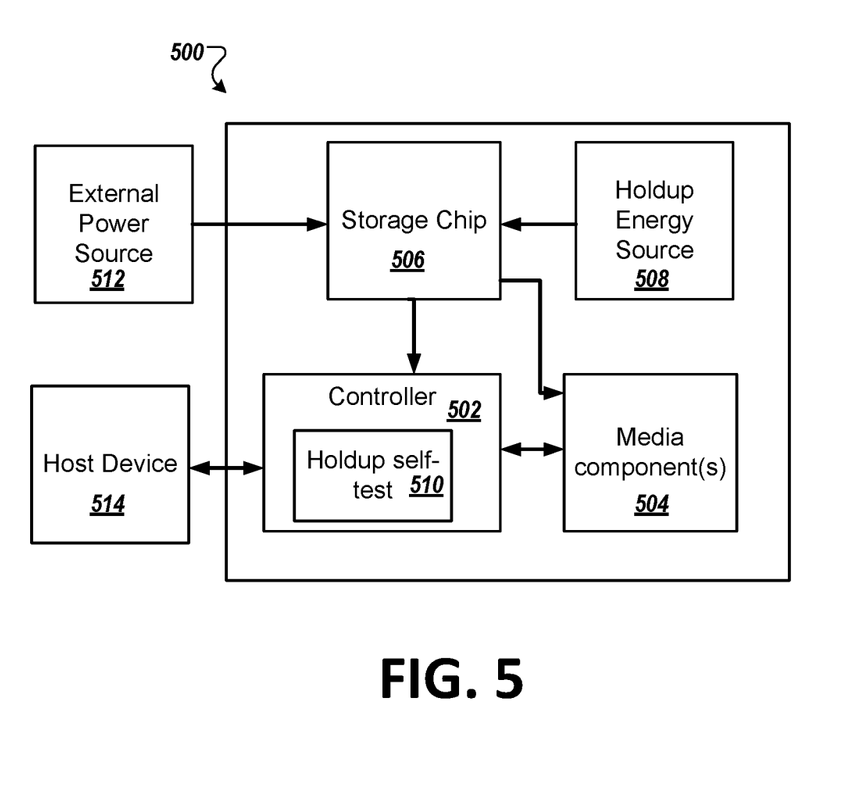
FIG. 5 is a block diagram of a SSD with a holdup energy source, one or more media component, a storage chip, and a controller with a holdup self-test mode in accordance with some embodiments of the present disclosure.

FIG. 5 is a block diagram of a SSD 500 with a controller 502, one or more memory components 504, a storage chip 506, and a holdup energy source 508 in accordance with some embodiments of the present disclosure. The controller 502 can include holdup self-test processing logic 510 to implement the self-test as described herein. The controller 502 can be any type of processing device that is coupled to the media components 504 and the storage chip 506. The controller 502 couples to a host device 514. The holdup energy source 508 can be any type of source that can store or otherwise provide holdup energy in the event of power loss from an external power source 512. The holdup energy source 508 can be part of a holdup circuit that provides an amount of holdup energy to the controller 502 and the one or more memory components 504 to permit a set of power loss operations to be performed in the event of power loss. The storage chip 506 is operatively coupled to the external power source 512, the holdup energy source 508, the controller 502, and the one or more memory components 504. The storage chip 506 can detect the loss of power from the external power source 512, send an interrupt to the controller 502, and selectively couple the holdup energy source 508 to the controller 502 and the memory components 504 responsive to the loss of power from the external power source 512. In other embodiments, the holdup energy source 508 can be selectively coupled to the controller 502 and the memory components 504 using other mechanisms than the storage chip 506, such as a power manager circuit.

During the holdup self-test 510, the controller 502 can receive a first request to perform the holdup self-test 510 in a self-test mode of the SSD 500. The controller 502 identifies a block of the memory component 504 that is available to write self-test data during the self-test mode responsive to the first request. The controller 502 detects a loss of power to the SSD while in the self-test mode. Responsive to detection of the loss of power, the controller 502 performs a continuous sequence of write operations to write the self-test data to the block using the holdup energy from the holdup energy source 508 (e.g., holdup circuit) until the amount of holdup energy is expended. As described herein, the amount of holdup energy can be all of the holdup energy, as well as other amounts as described herein. After reboot of the SSD 500, the controller 502 determines a number of write operations successfully completed in the block by the continuous sequence of write operations before the amount of holdup energy is expended. The controller 502 determines whether the number of write operations successfully completed satisfies a defect criterion. Responsive to the number of write operations successfully completed satisfying the defect criterion, the controller 502 reports a defect associated with the holdup energy source 508.

In one embodiment, the holdup energy source 508 includes an array of capacitors to store the amount of holdup energy for the SSD 500 and an energy transfer circuit to transfer the amount of holdup energy stored in the array of capacitors to the controller 502 and the memory component(s) 504 responsive to the loss of power. The array of capacitors has an expected energy capacity and the number of write operations successfully completed represents an actual capacity of the array of capacitors. The defect criterion can define a minimum number of write operations needed to perform the set of power loss operations. The minimum number of write operations represents an expected minimum capacity of the array of capacitors without a defect. The defect is detected by the holdup self-test 510 responsive to the number of write operations successfully completed being less than the minimum number of write operations corresponding to the expected minimum capacity.

In another embodiment, a holdup circuit includes a power manager circuit coupled between the external power source 512 and the controller 502 and the memory component 504 and the holdup energy source 508. The holdup energy source 508 is selectively coupled to the controller 502 and the memory component 504. The power manager circuit is configured to de-couple the external power source 512 from the controller 502 and the memory component 504 to cause the loss of power to the SSD 500 while in the self-test mode. The power manager circuit can temporality disconnects the SSD 500 from the external power source 512 to initiate the loss of power to the SSD 500 while the SSD 500 is in the self-test mode.

In one embodiment, the controller 502 detects the loss of power by receiving an interrupt indicating the loss of power. The interrupt can be received from the storage chip 506. Alternatively, the interrupt can be received from the power manager circuit. In other embodiments, the host device 514 can coordinate with the controller 502 to remove power from the external power source 512 for purposes of the holdup self-test 510. In another embodiment, the first request to initiate the holdup self-test 510 is received from a test device (not illustrated in FIG. 5). The test device can be used during manufacturing of the SSD 500. In another embodiment, the first request to initiate the holdup self-test 510 is received from the host device 514, such as in response to a customer diagnostic request. The customer diagnostic request can be used to evaluate whether the holdup energy source 508 on the SSD 500 is still within specification while deployed in the field. For potentially safety-critical applications, such as automotive, the holdup self-test 510 can be used to monitor and diagnose specific defects required to meet a customer reliability requirement, a fault-detection requirement, or the like. This request can be received during deployment of the SSD 500 in a computer system having the host device 514 or after manufacturing of the SSD 500. Alternatively, this first request can be received from the host device 514 during manufacturing or testing of the SSD 500.

The first request to initiate the holdup self-test 510 can operate to transition to a state in which the continuous sequence of write operations begins upon detection of a next power loss event and in which, after the reboot of the SSD 500, the self-test data is read from the block and compared to control data to determine the number of write operations successfully completed before the amount of holdup energy in the holdup energy source 508 is expended. As described herein, the amount of holdup energy can be all of the holdup energy, as well as other amounts as described herein. The test data can be used to determine whether the holdup energy source 508 has a defect. For example, a defect criterion can be defined for a holdup requirement for the holdup energy source 508. In another embodiment, the controller 502 determines whether the number satisfies the defect criterion by comparing the number with a specified number of operations specified in a holdup requirement for the holdup circuit and detects the defect responsive to the number being less than the specified number of operations specified in the holdup requirement.

Although the embodiment described above is directed to writing to an available block of a memory component, the controller 502 can identify multiple blocks in multiple memory components. For example, the controller 502 can identify a first block of a first memory component and a second block of a second memory component, the first and second blocks being available to write the self-test data responsive to the first request. In some cases, the same self-test data can be written to each of the available blocks. In other embodiments, a first portion of the self-test data is written to a first block and a second portion of the self-test data is written to the second block. The controller 502 performs, responsive to the loss of power, the continuous sequence of write operations to write the self-test data to the first block and the second block using the holdup energy from the holdup circuit (holdup energy source 508) until the amount of holdup energy is expended. After reboot of the SSD 500, the controller 502 determines the number of the write operations successfully completed in the first block and the second block. The continuous sequence of write operations to write the self-test data to the first block and the second block can be part of a write pattern that emulates actual power loss operations performed during a loss of power to the SSD 500 while not in the self-test mode.

In a further embodiment, the controller 502 can erase the self-test data written to the any of the available blocks and report results of the holdup self-test 510. The results can include the defect associated with the holdup circuit responsive to the number of write operations successfully completed satisfying the defect criterion.

In a further embodiment, the controller 502 sends a second request to the host device 514 to disconnect the SSD 500 from the external power source 512 while the SSD 500 is in the self-test mode. Subsequent to the second request, the controller 502 detects the loss of power to the SSD 500 while in the self-test mode, such as by receiving an interrupt from the storage chip 506 as described herein. In this manner, the controller 502 actively initiates the power loss event to start the write sequence for the holdup self-test 510.

In another embodiment, instead of a SSD, the drive has a disk and the holdup energy source is created from the disk spinning. The holdup circuit can include an energy transfer circuit to transfer the amount of holdup energy created from the disk spinning before the loss of power to the controller and the memory component responsive to the loss power.

In another embodiment, a storage system includes a power manager circuit, multiple memory components, and a controller coupled together. The power manager circuit supplies power to the controller and the memory components from an external power source or a secondary power source. The controller, in response to a request, identifies a set of available blocks in the memory components. The controller detects a power loss condition in which power from the external power source is lost. Responsive to detection of the power loss condition, the controller continuously writes test data in the set of available blocks in a specified pattern until an amount of power from the secondary power source is expended by supplying power to the controller and the memory components during the power loss condition. Responsive to restoration of the power from the external power source, the controller reads written data results from the set of available blocks and determines whether the secondary power source has a defect using at least the written data results. Responsive to detection of the defect, the controller reports the defect of the secondary power source.

In a further embodiment, the controller can determine whether there is a defect by identifying the set of available blocks in which the test data is continuously written and comparing the written data results read from the set of available blocks with control data to determine a number of write operations successfully completed before the amount of power from the secondary power source is expended. The controller determines whether the number write operations successfully completed satisfies a defect criterion. The defect criterion corresponds to a minimum energy capacity needed to perform a set of power loss operations to comply with a holdup requirement. Responsive to the number write operations successfully completed satisfying the defect criterion, the controller reports that the secondary power source has the defect. In some cases, the defect can be a marginal degradation in the holdup energy source, such as one open capacitor in an array of capacitors.

Figure 6:
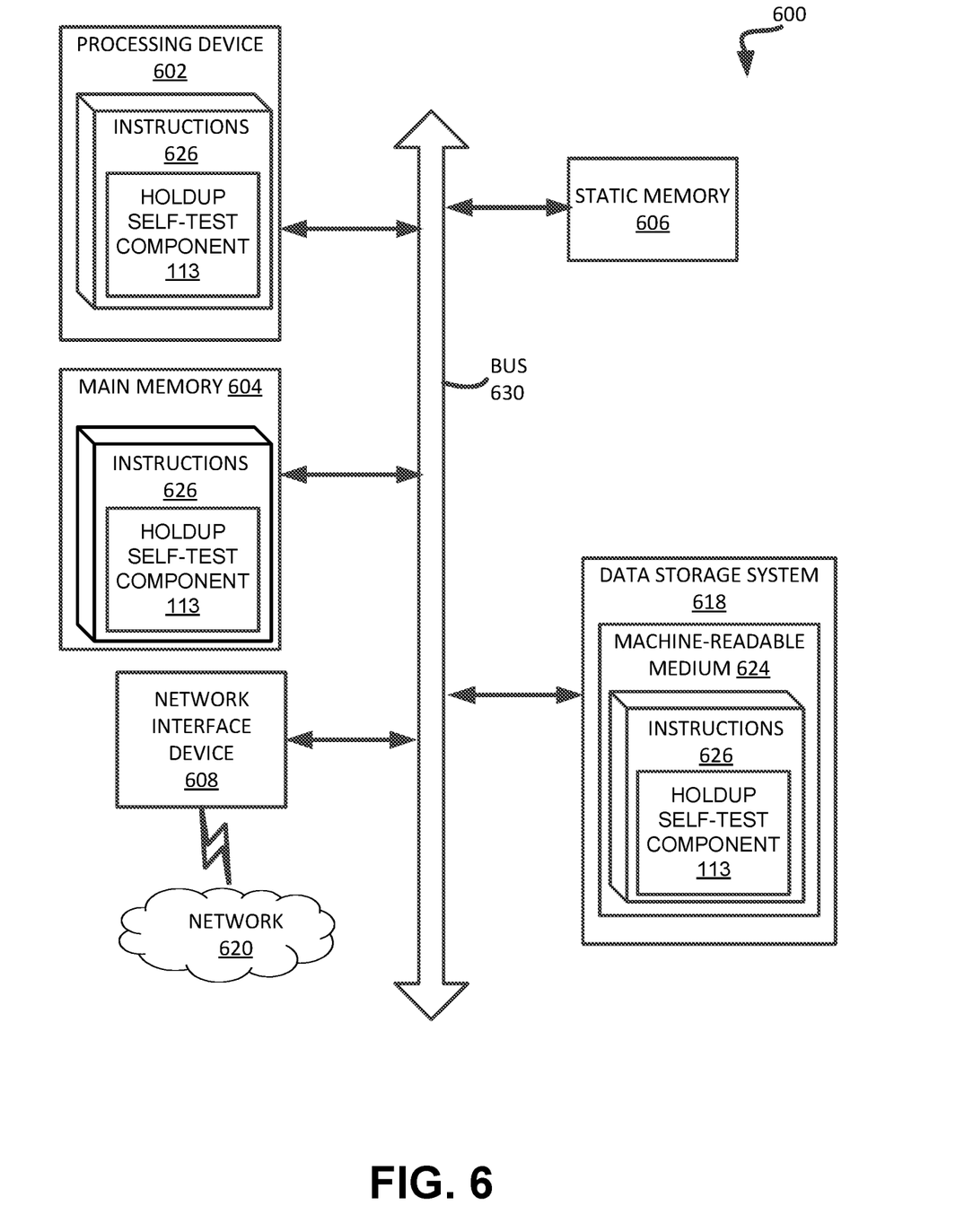
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the holdup self-test component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable storage medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a holdup self-test component (e.g., the holdup self-test component 113 of FIG. 1). While the machine-readable storage medium 624 is shown in an example embodiment to be a single medium, the term "machine-readable storage medium" or "computer-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a holdup circuit to provide holdup energy to the system for a set of power loss operations by the system;
   a memory component operatively coupled with the holdup circuit; and
   a processing device, operatively coupled with the memory component and the holdup circuit, to:
      receive a first request to perform a holdup self-test in a self-test mode of the system;
      identify a memory location of the memory component that is available to write self-test data during the self-test mode responsive to the first request;
      detect a loss of power to the system while in the self-test mode;
      responsive to detection of the loss of power, perform a continuous sequence of write operations to write the self-test data to the memory location using the holdup energy from the holdup circuit until an amount of holdup energy is expended;
      after reboot of the system, determine a number of write operations successfully completed in the memory location by the continuous sequence of write operations before the amount of holdup energy is expended;
      determine whether the number of write operations successfully completed satisfies a defect criterion; and
      responsive to the number of write operations successfully completed satisfying the defect criterion, report a defect associated with the holdup circuit.

2. The system of claim 1, wherein the holdup circuit comprises:
   an array of capacitors to store holdup energy, wherein the array of capacitors has an expected energy capacity; and
   an energy transfer circuit to transfer the holdup energy stored in the array of capacitors to the processing device and the memory component responsive to the loss of power, wherein the number of write operations successfully completed represents an actual capacity of the array of capacitors, wherein the defect criterion defines a minimum number of write operations needed to perform the set of power loss operations, wherein the minimum number of write operations represents an expected minimum capacity of the array of capacitors, wherein the defect is detected responsive to the number of write operations successfully completed being less than the minimum number of write operations corresponding to the expected minimum capacity.

3. The system of claim 1, wherein the memory component is a disk, wherein the holdup circuit comprises:
   an energy transfer circuit to transfer the holdup energy created from the disk spinning before the loss of power to the processing device and the memory component responsive to the loss of power,
   wherein the number of write operations successfully completed represents an actual capacity of the holdup circuit, wherein the defect criterion defines a minimum number of write operations needed to perform the set of power loss operations, wherein the minimum number of write operations represents an expected minimum capacity created from the disk spinning, wherein the defect is detected responsive to the number of write operations successfully completed being less than the minimum number of write operations corresponding to the expected minimum capacity.

4. The system of claim 1, wherein the defect is at least one of an open capacitor in an array of capacitors of the holdup circuit, a malfunctioning cell of a battery of the holdup circuit, an improper resistor setting in the holdup circuit, or an improper function by the holdup circuit comprising a storage chip and a holdup energy source.

5. The system of claim 1, wherein the holdup circuit comprises:
   a holdup energy source selectively coupled to the processing device and the memory component responsive to the loss of power; and
   a storage chip operatively coupled to an external power source, the holdup energy source, the processing device, and the memory component, wherein the storage chip is to detect the loss of power from the external power source, send an interrupt to the processing device, and selectively couple the holdup energy source to the processing device and the memory component responsive to the loss of power from the external power source.

6. The system of claim 1, wherein the holdup circuit comprises:
   a power manager circuit coupled between an external power source and the processing device and the memory component; and
   a holdup energy source selectively coupled to the processing device, the memory component, and the power manager circuit, wherein the power manager circuit is configured to de-couple the external power source from the processing device and the memory component to cause the loss of power to the system while in the self-test mode.

7. The system of claim 1, wherein the processing device, to detect the loss of power, is to receive an interrupt indicating the loss of power, wherein the defect criterion corresponds to a holdup requirement for the holdup circuit.

8. The system of claim 1, wherein the processing device is to receive the first request from a test device during manufacturing of the system.

9. The system of claim 1, wherein the processing device is to receive the first request from a host device coupled to the system.

10. The system of claim 1, wherein the processing device, responsive to the first request, is to transition to a state in which the continuous sequence of write operations begins upon detection of a next power loss event and in which, after the reboot of the system, the self-test data is read from the memory location and compared to control data to determine the number of write operations successfully completed before the amount of holdup energy is expended.

11. The system of claim 1, further comprising a second memory component operatively coupled to the processing device and the holdup circuit, wherein the processing device is further to:
  identify a second memory location of the second memory component that is available to write the self-test data responsive to the first request;
  responsive to the loss of power, perform the continuous sequence of write operations to write the self-test data to the memory location and the second memory location using the holdup energy from the holdup circuit until the amount of holdup energy is expended; and
  after reboot of the system, determine the number of the write operations successfully completed in the memory location and the second memory location, wherein the continuous sequence of write operations to write the self-test data to the memory location and the second memory location is at least a part of a write pattern that emulates actual power loss operations performed during a loss of power to the system while not in the self-test mode.

12. The system of claim 1, wherein the processing device is further to:
  erase the self-test data written to the memory location; and
  report results of the holdup self-test, wherein the results include the defect associated with the holdup circuit responsive to the number of write operations successfully completed satisfying the defect criterion.

13. The system of claim 1, wherein the processing device is further to:
  send a second request to a host device, coupled to the system, to disconnect the system from an external power source while the system is in the self-test mode; and
  subsequent to the second request, detect the loss of power to the system while in the self-test mode.

14. A storage system comprising:
  a power manager circuit to supply power from an external power source or a secondary power source;
  a plurality of memory components coupled to the power manager circuit; and
  a controller coupled to the power manager circuit and the plurality of memory components, wherein the controller, in response to a request, is to:
    identify a set of available blocks in the plurality of memory components, wherein the set of available blocks comprises an available block in each of the plurality of memory components;
    detect a power loss condition in which power from the external power source is lost;
    responsive to detection of the power loss condition, continuously write test data in the set of available blocks in a specified pattern until an amount of power from the secondary power source is expended by supplying power to the controller and the plurality of memory components during the power loss condition;
    responsive to restoration of the power from the external power source, read written data results from the set of available blocks and determine whether the secondary power source has a defect using at least the written data results; and
    responsive to detection of the defect, report the defect of the secondary power source.

15. The storage system of claim 14, wherein the controller, to determine whether the secondary power source has the defect, is to:
  identify the set of available blocks in which the test data is continuously written;
  compare the written data results read from the set of available blocks with control data to determine a number of write operations successfully completed before the amount of power from the secondary power source is expended;
  determine whether the number of write operations successfully completed satisfies a defect criterion, wherein the defect criterion corresponds to a minimum energy capacity needed to perform a set of power loss operations to comply with a holdup requirement; and
  responsive to the number of write operations successfully completed satisfying the defect criterion, report that the secondary power source has the defect; and
  responsive to the number not satisfying the defect criterion, report that the secondary power source does not have the defect.

16. The storage system of claim 14, wherein the secondary power source comprises an array of capacitors, and wherein the defect is at least one of an open capacitor in the array of capacitors.

17. A method comprising:
  receiving, by a controller, a request to transition to a holdup self-test mode to check for a defect in a secondary power source of a memory system comprising the controller and a plurality of memory components;
  responsive to the request, identifying a set of available memory locations in the plurality of memory components;
  detecting a power loss condition of the memory system in which power supplied by a primary power source to the memory system is removed;
  responsive to detection of the power loss condition, supplying power to the memory system via a secondary power source;
  responsive to detection of the power loss condition, writing a specified pattern of test data in the set of available memory locations until an amount of power from the secondary power source is expended;
  responsive to restoration of the power to the memory system by the primary power source, determining whether the secondary power source has a defect using results of the specified pattern of test data written in the set of available memory locations before the amount of power from the secondary power is expended; and
  reporting that the secondary power source has the defect responsive to a determination that the secondary power source has the defect.

18. The method of claim 17, wherein the determining whether the secondary power source has the defect comprises:
  reading written data results from the set of available memory locations;
  comparing the written data results with control data;
  determining a number of write operations successfully completed before the amount of power from the secondary power source is expended;
  determining whether the number of write operations successfully completed satisfies a defect criterion; and
  responsive to the number of write operations successfully completed satisfying the defect criterion, reporting that the secondary power source has the defect; and responsive to the number not satisfying the defect criterion, reporting that the secondary power source does not have the defect.

19. The method of claim 17, wherein the receiving the request comprises receiving the request from a host device coupled to the memory system, wherein the reporting that the secondary power source has the defect comprises sending a response to the host device, the response comprising an indication of the defect.

20. The method of claim 17, wherein the detecting the power loss condition of the memory system comprises receiving an interrupt indicating a loss of power.

* * * * *